(12) United States Patent
Okamoto et al.

(10) Patent No.: US 8,492,644 B2
(45) Date of Patent: Jul. 23, 2013

(54) SOLAR CELL MODULE AND METHOD OF MANUFACTURING THE SAME

(75) Inventors: Shingo Okamoto, Toyonaka (JP); Shihomi Nakatani, Kaiduka (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 1527 days.

(21) Appl. No.: 11/391,357

(22) Filed: Mar. 29, 2006

(65) Prior Publication Data

US 2006/0219290 A1    Oct. 5, 2006

(30) Foreign Application Priority Data

Mar. 31, 2005   (JP) .................................. 2005-102434
Mar. 15, 2006   (JP) .................................. 2006-71230

(51) Int. Cl.
*H02N 6/00*   (2006.01)

(52) U.S. Cl.
USPC ............ 136/243; 136/244; 136/246; 136/256

(58) Field of Classification Search
USPC ........................................................ 136/243
See application file for complete search history.

(56) References Cited

U.S. PATENT DOCUMENTS

| | | | | |
|---|---|---|---|---|
| 4,534,502 | A * | 8/1985 | Piurek | 228/102 |
| 6,689,235 | B2 * | 2/2004 | Hatano et al. | 148/681 |
| 7,196,907 | B2 * | 3/2007 | Zheng | 361/760 |
| 2004/0261840 | A1 * | 12/2004 | Schmit et al. | 136/258 |
| 2005/0022857 | A1 * | 2/2005 | Daroczi et al. | 136/244 |

FOREIGN PATENT DOCUMENTS

| | | |
|---|---|---|
| EP | 1 484 801 | 12/2004 |
| EP | 1484801 A2 * | 12/2004 |
| JP | 10-93120 | 4/1998 |
| JP | 11-214733 | 8/1999 |
| JP | 2002-359388 | 12/2002 |
| JP | 2003-168811 | 6/2003 |
| JP | 2003-298096 | 10/2003 |
| JP | 2004-363293 | 12/2004 |
| WO | WO 96/17387 | 6/1996 |
| WO | WO9617387 * | 6/1996 |

OTHER PUBLICATIONS

Troshchenko et al., "Effects of single plastic prestrains on crack resistance", Strength of Materials, 1989.*
European Search Report mailed Aug. 24, 2007 on corresponding application (3 pages).
Office Action dated Aug. 31, 2010 corresponding to Japanese Patent Application No. 2006-071230.
Second Office Action dated Jun. 21, 2011 corresponding to Japanese Patent Application No. 2006-071230.

* cited by examiner

*Primary Examiner* — Jennifer Michener
*Assistant Examiner* — Matthew Martin
(74) *Attorney, Agent, or Firm* — Kratz, Quintos & Hanson, LLP

(57) ABSTRACT

An object is to provide a solar cell module capable of reducing warping of each solar cell due to a linear expansion coefficient difference between the solar cell and a wiring line member to prevent damages effectively without raising any cost increase. A solar cell module comprises a plurality of solar cells and is constituted by electrically connecting adjacent solar cells to one another by wiring line members, a base material of the wiring line member has a plastic strain of 2% or less in a drawing direction, and the solar cell is constituted of a crystalline wafer having a thickness of 200 microns or less.

17 Claims, 8 Drawing Sheets

SOLAR CELL MODULE AND METHOD OF MANUFACTURING THE SAME

BACKGROUND OF THE INVENTION

The present invention relates to a solar cell module comprising a plurality of solar cells and constituted by connecting adjacent solar cells to one another by wiring line members (leads), and a method of manufacturing the module.

In recent years, there have been increasing expectations for clean energy in view of protection of global environments from global warming or the like. A solar cell module which converts solar energy directly into electric energy is noted as a clean energy source. In this case, the solar cell module comprises a plurality of solar cells, and, for example, wiring line members referred to as tab leads are connected to these adjacent solar cells with a solder (or paste) to electrically connect the cells to one another.

In this case, there are used a series of wiring line members ranging from the surface of one of the adjacent solar cells to the back surface side of the other solar cell (see, e.g., Japanese Patent Application Laid-Open No. 2004-363293 (Document 1)). There is also a case where a wiring line member connected to the surface of one solar cell is connected to a wiring line member connected to the back surface side of the other solar cell (see, e.g., Jpn. Pat. Appln. KOKAI Publication No. 2002-359388 (Document 2)).

This wiring line member is constituted of a copper foil usually having a width of 1.5 mm to 2 mm and a thickness of about 150 μm (microns) to 200 μm, and the member is prepared in a state in which the member is wound around a bobbin in manufacturing steps. The wiring line member is coated beforehand with a solder, the member having a predetermined dimension is drawn from the bobbin and cut, and the member laid on the solar cell is heated with hot air, a lamp heater or the like, and soldered.

Here, by the subsequent natural cooling, the wiring line member expanded by heat when soldered, and the solar cell of the corresponding portion contract. On the other hand, a linear expansion coefficient of copper is about $16.7 \times 10^{-6}/°$ C., whereas a silicon substrate of the solar cell has a linear expansion coefficient of about $2.33 \times 10^{-6}/°$ C. Therefore, the wiring line member after the soldering contracts more largely than the solar cell, and an acting force accompanying a difference in this contraction is applied to the solar cell.

On the other hand, since the wiring line member is wound around the bobbin as described above, the drawn wiring line member has a curled shape. Moreover, the member meanders in some case. This also applies to a bent wiring line member. Such nonlinear wiring line member in which the curled or meandered state is generated deviates from a predetermined soldered position on the solar cell and a collector electrode. There is a possibility that characteristics deteriorate owing to an appearance defect or reduction of an irradiated area. Therefore, heretofore the cut wiring line member is pulled with a predetermined load, and straightened out, or the wiring line member is cut after the straightening out.

After the wiring line member is soldered to the solar cell, the acting force accompanying the above-described contraction difference is applied to the solar cell, but the forces acting between the wiring line member on the front surface side of the solar cell and the solar cell and between the wiring line member on the back surface side and the solar cell act in a direction in which the forces cancel each other. However, it is supposed that the forces are not equal to each other and, as a result, the solar cell is warped.

In addition, a conventional single-crystal or polycrystal solar cell has a thickness of about 300 μm to 350 μm. Therefore, even when the acting force due to the contraction of such wiring line member is applied, the solar cell module is hardly warped as shown in FIG. 5. It is to be noted that in this drawing, reference numeral 1 denotes solar cells, and 2 denotes wiring line members.

However, a thickness of a wafer for general use in the solar cell is about 150 μm to 200 μm, and is remarkably small for the purpose of reducing material costs. Therefore, there occurs a problem that the contraction of the wiring line members 2 acts, and the solar cell module largely warps as shown in FIG. 6.

For example, in a solar cell (the solar cell preferably has a size of 125 mm square or more) constituted of a crystalline wafer having an about 125 mm square size and a thickness of about 200 μm, it is seen that warpage reaches as much as 3 mm which is defined by the longest distance D between a horizontal line L of FIG. 6 and the solar cell 1. When such warpage is generated, an operation efficiency deteriorates in the manufacturing steps. Moreover, damages are generated such as breaks or cracks. Therefore, a manufacturing yield drops and the decrease in reliability is feared.

To solve this problem, a material such as titanium whose linear expansion coefficient is close to that of the solar cell is used as the wiring line member in Document 1. However, such metal is remarkably expensive as compared with copper, and an electric resistance value of the metal is higher than that of copper. Therefore, the metal needs to be combined with another substance, and there is a further problem that the member costs rise.

SUMMARY OF THE INVENTION

The present invention has been developed in order to solve such conventional technical problem, and an object is to provide a solar cell module and a method of manufacturing the module which can reduce warpage of a solar cell due to a difference between linear expansion coefficients of the solar cell and a wiring line member and which can effectively prevent damages without incurring any cost rise.

As a result of various investigations, as shown in FIG. 7, the present inventors have found that to reduce a load in a case where non-linearity of a wiring line member is corrected is effective for reducing warping of the solar cell to which the wiring line member is attached in order to reduce warping that becomes conspicuous at a time when a thickness of the solar cell decreases. As shown in FIG. 4, when the load is applied, plastic strain (=elongation/initial length=percentage of elongation) is generated in a base material of the wiring line member, but as a result of further investigation, it has been clarified that there is a correlation between this elongation length and the warping of the solar cell.

Here, FIG. 9 shows a relation between the warping of the solar cell and a yield, and FIG. 10 shows a relation between a percentage of elongation of the wiring line member=the plastic strain (=elongation/initial length) and the warping of the solar cell. It is to be noted that in FIGS. 4, 7, 9, and 10, the wiring line member is made of copper having a width of 2 mm and a thickness of 150 μm, and the solar cell has a 125 mm square size. And the thickness in FIG. 7 and FIG. 9 shows the thickness of the solar cell (substrate).

As obvious from FIG. 9, when the solar cell warps in excess of 2 mm, the yield remarkably drops. Therefore, it has been found that the warpage of the solar cell needs to be reduced to 2 mm or less in order to improve the yield. Moreover, it is seen from FIG. 7 that a load applied to the wiring line member is 3.8 kgf at a time when the solar cell having a thickness of 150 μm warps by 2 mm. It is seen from FIG. 4 that the plastic strain (percentage of elongation) of the wiring line member at that time is 0.5%. That is, it is seen that the plastic strain of the wiring line member needs to be set to 0.5% or less in order to suppress the warping of the solar cell having a thickness of 150 μm to 2 mm or less.

Similarly, in the solar cell having a thickness of 170 μm, a load on the wiring line member needs to be set to 4.2 kgf or less. That is, the plastic strain is set to 1% or less. In a solar cell having a thickness of 200 μm, a load on the wiring line member needs to be set to 4.5 kgf or less, that is, the plastic strain needs to be 2% or less. This behavior is shown in FIG. 10.

Moreover, when the warping of the solar cell is reduced, improvements of the yield and reliability are expected. Therefore, in the solar cell having a thickness of 200 μm, the plastic strain of the wiring line member is set to 0.4% or less. In the solar cell having a thickness of 170 μm, the plastic strain of the wiring line member is set to 0.2% or less. In the solar cell having a thickness of 150 μm, the plastic strain of the wiring line member is set to 0.1% or less. Accordingly, the warpage can be reduced, and further effects are expected.

Furthermore, attempts are preferably made to reduce the warpage by setting the plastic strain (percentage of elongation) capable of straightening the wiring line member to be larger than 0% and to 0.03% (FIG. 7) or less. However, from a viewpoint of productivity, the plastic strain is preferably set to be above 0.03% in order to straighten the wiring line member wound around the bobbin.

Therefore, in a first aspect of the present invention, a solar cell module comprises a plurality of solar cells and is constituted by electrically connecting adjacent solar cells to one another by wiring line members, wherein a base material of the wiring line member has a plastic strain of 2% or less in a drawing direction. The plastic strain is larger than 0%, and is preferably 1% or less, more preferably 0.5% or less.

In a second aspect of the present invention, in the above invention, the solar cell is constituted of a crystalline wafer having a thickness of 200-microns or less. The thickness of the wafer may be 180 microns or less, further 150 microns or less.

In a third aspect of the present invention, in the solar cell module of the above inventions, the plastic strain in the drawing direction of the base material of a portion of the wiring line member on a front surface side of the solar cell differs from that of a portion of the wiring line member on a back surface side of the solar cell.

In a fourth aspect of the present invention, in the solar cell module of the above inventions, the base material of the wiring line member is copper (purity 99% or more).

According to the present invention, in the solar cell module comprising a plurality of solar cells and constituted by electrically connecting the adjacent solar cells to one another by wiring line members, the plastic strain of the base material of the wiring line member in the drawing direction is 2% or less. Therefore, contraction of the wiring line member decreases after the wiring line member is (mechanically) connected to the solar cell. It is possible to inhibit the warping of the solar cell from being generated by the linear expansion coefficient difference between the solar cell and the wiring line member.

Consequently, it is possible to inhibit the solar cell from being damaged, and improve the yield without using any expensive material as the wiring line member. This invention is remarkably effective in a case where the solar cell is constituted of the crystalline wafer having a thickness of 200 microns or less as in the second aspect of the present invention, especially in a case where the wiring line member comprises copper as in the fourth aspect of the present invention.

Moreover, in a case where the wiring line members are connected to the front surface side and the back surface side of the solar cell beforehand to connect the wiring line members to one another, as in the third aspect of the present invention, there is used, in the wiring line member, the plastic strain in the drawing direction of the portion of the base material on the front surface side of the solar cell differs from that of the portion of the base material on the back surface side of the solar cell. Moreover, a material having a small plastic strain in the drawing direction is used in the wiring line member disposed on the surface which contracts more largely. In consequence, it is possible to further suppress the warping of the solar cell.

A manufacturing method of a fifth aspect of the present invention is a method of manufacturing a solar cell module, comprising the step of: electrically connecting adjacent solar cells to one another by wiring line members, the method further comprising: the step of correcting linearity of each wiring line member prior to the step of connecting the wiring line members to the solar cells, the correcting step comprises the step of pulling the wiring line member in a drawing direction within range in which a plastic strain of a base material of the wiring line member in the drawing direction is 2% or less.

According to the present invention, to electrically connect the adjacent solar cells to one another by the wiring line members, thereby manufacturing the solar cell module, the method comprises the step of correcting the linearity of each wiring line member prior to the step of connecting the wiring line member to the solar cell. In the correcting step, the wiring line member is pulled in the drawing direction within range in which the plastic strain of the base material of the wiring line member in the drawing direction is 2% or less. Therefore, it is possible to reduce the contraction of the wiring line member after (mechanically) connecting the wiring line member to the solar cell.

In consequence, it is possible to inhibit the warping of the solar cell from being generated owing to a linear expansion coefficient difference between the solar cell and the wiring line member. It is possible to inhibit the solar cell from being damaged, and improve operation efficiencies of the manufacturing steps and the yield without using any expensive material as the wiring line member, and provide a solar cell which has high reliability.

In a sixth aspect of the present invention, in the manufacturing method of the above invention, the correcting step comprises the step of: separately pulling the wiring line member in the drawing direction so that the plastic strain of the base material in the drawing direction changes on a stepped portion as a boundary by use of the step of disposing the stepped portion on a portion of the wiring line member disposed between the solar cells.

As in the present invention, in the correcting step, the wiring line member is separately pulled in the drawing direction so that the plastic strain of the base material in the drawing direction changes on the stepped portion as the boundary by use of the step of disposing the stepped portion on the portion of the wiring line member disposed between the solar cells. Accordingly, when reducing the drawing-direction plastic strain of the wiring line member disposed on the surface which more largely contracts, it is possible to further inhibit the solar cell from being warped.

DETAILED DESCRIPTION OF THE PREFERRED EMBODIMENT

Embodiments of the present invention will be described hereinafter in detail with reference to the drawings.

Embodiment 1

Figure 1:
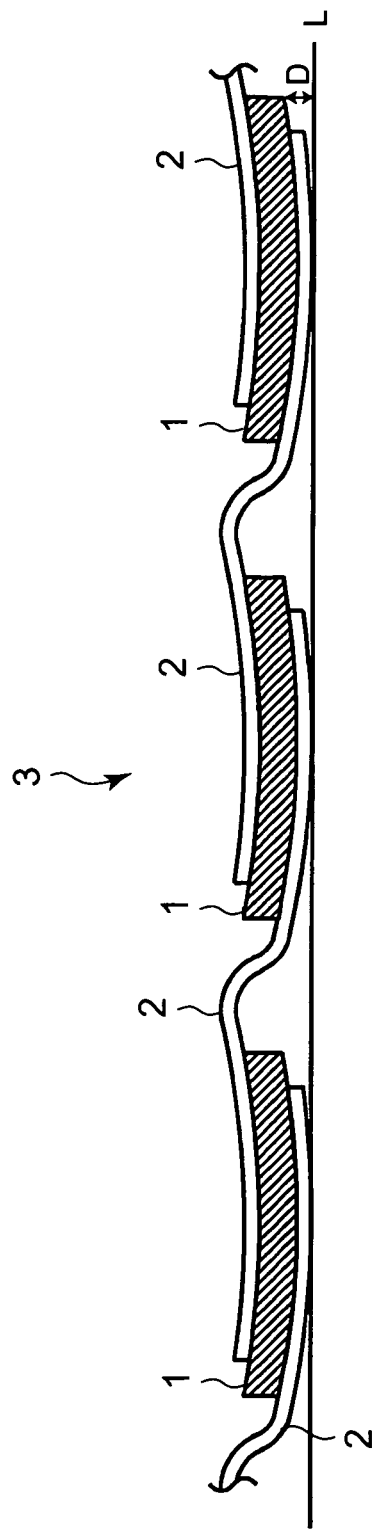
FIG. 1 is a side view of a string of solar cell module to which the present invention is applied (Embodiment 1)

FIG. 1 is a side view of a string 3 of solar cells showing one embodiment of the present invention. It is to be noted that in the embodiment described hereinafter, solar cells 1 and the like are usable in which there is used a crystalline material such as single-crystal silicon or polycrystal silicon, an amorphous material using amorphous silicon, or a crystalline wafer such as a single-crystal amorphous hybrid material having silicon amorphous layers formed on opposite surfaces of a substrate made of a single crystal. However, since a technology of manufacturing the solar cells 1 itself is heretofore known, detailed description is omitted.

In the present embodiment, each of the solar cells 1 is formed into an about 125 mm square or almost square, and a thickness of the substrate (cell) is remarkably small in a range of 150 μm to 200 μm. In the present embodiment, for example, an amorphous silicon membrane which thickness is 20 nm is coated and formed on both surfaces of a silicon monocrystal substrate of the solar cell. And a ITO membrane which thickness is 0.1 micron is coated and formed on each amorphous silicon membrane. Two collector electrodes (width of about 2 mm) are arranged in parallel with each other on opposite surfaces of the solar cell, and a large number of branched electrodes (width of about 50 μm) are extended from the opposite sides of the collector electrode. Wiring line members 2 referred to as tab leads are soldered to the collector electrodes of such solar cell 1.

In this case, each of the wiring line members 2 is constituted of a conductive copper (base material: copper purity 99.9% or more) foil having a width of about 1.5 mm and 2 mm, and the surface of the member is coated with a solder by plating. Moreover, the wiring line member 2 is disposed so as to range from the front surface side (plus side) of one of adjacent solar cells 1, 1 to the back surface side (minus side) of the other solar cell 1 among a plurality of solar cells 1 . . . disposed on a predetermined conveyance belt. The member is heated from above with hot air or a lamp heater at +200° C. to +350° C., and the undersurface of the member is kept warm with a hot plate. Accordingly, the solder on the surface of the wiring line member 2 (melting temperature of the solder is set to about +220° C.) is electrically connected to each of the solar cells 1, 1 (connecting step). This is performed on a plurality of solar cells 1 . . . , thereby constituting the string 3.

The plural of string 3 constituted in this manner is sealed (heated and attached under pressure) with a filling material such as an ethylene vinyl acetate copolymer resin (EVA) between a front surface side member (not shown) constituted of a glass plate, a plastic plate, or a resin film having photo permeability and resistance to weather and a back surface side member (not shown) constituted of a resin film, a glass plate, a plastic plate or the like, whereby the solar cell module is manufactured.

Figure 2:
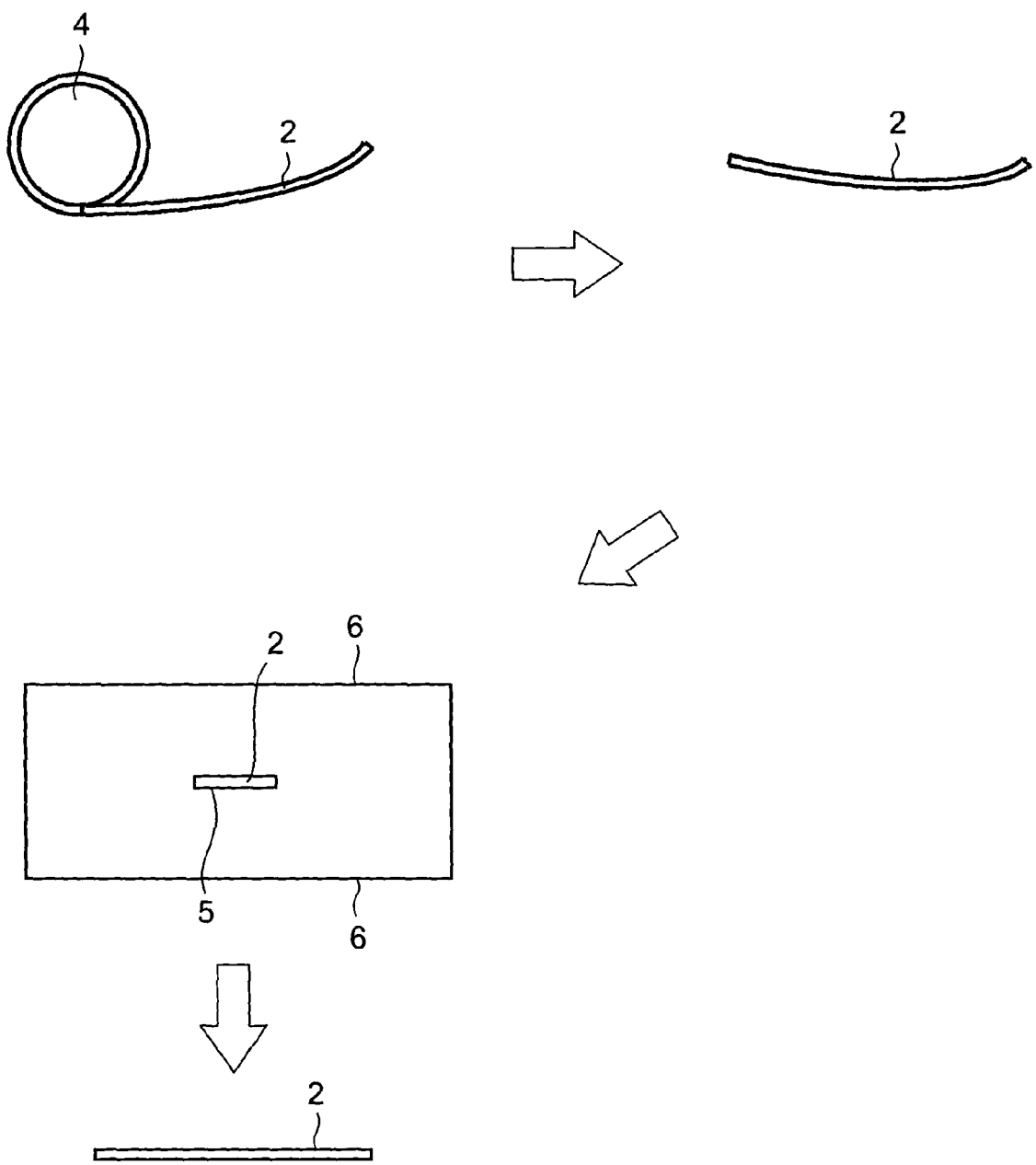
FIG. 2 is an explanatory view of a method of correcting a wiring line member in the present invention.

Here, the wiring line member 2 is wound around a bobbin 4 as shown in FIG. 2. Moreover, a predetermined amount of the member is drawn from this bobbin 4, cut, and used. However, the drawn and cut wiring line member 2 is wound and curled as shown in FIG. 2. Since the member has a width of 1.5 mm to 2 mm, the member is sometimes formed into a meandered shape. To solve the problem, prior to the connecting step, this curl and meander are removed through an opening 5 of a jig 6 shown in the center of the drawing, or using a roller, and the member is linearly (FIG. 2) corrected by use of a tensile force set to be not more than a defined force (correcting step).

In this case, since the wiring line member 2 is hardly loaded (force) in the drawing direction, the wiring line member 2 is usable in a wiring line of the solar cell substantially without developing a plastic strain (=elongation/initial length=percentage of elongation) to the member having a state drawn from the bobbin 4 (non-linear state shown in an upper right part of FIG. 2). Therefore, it is possible to largely suppress warping of the solar cell.

Figure 7:
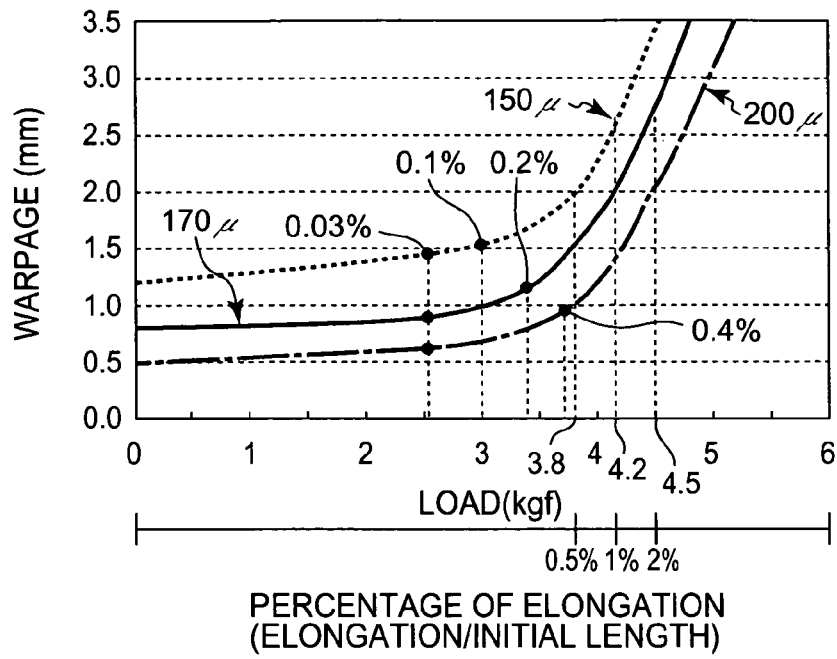
FIG. 7 is a diagram showing an average warpage of the solar cell with respect to the load (tensile load) on the wiring line member in the drawing direction.
Figure 9:
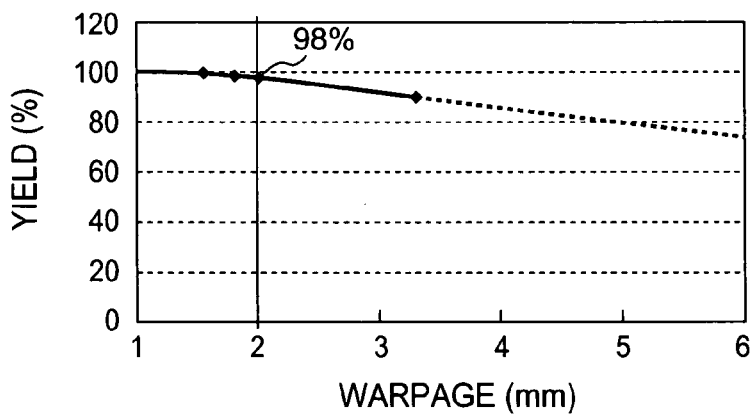
FIG. 9 is a diagram showing a relation between warping of the solar cell and yield.
Figure 10:
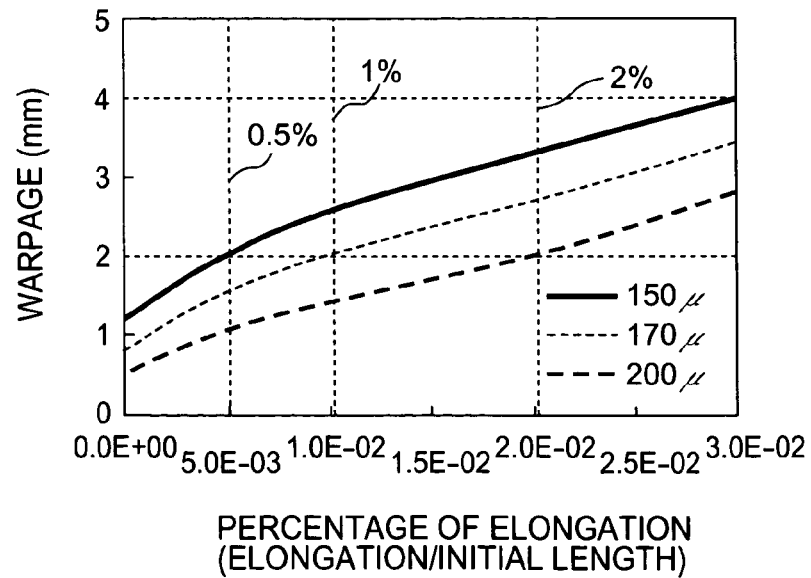
FIG. 10 is a diagram showing a relation between a percentage of elongation (=plastic strain) of the wiring line member and the warping of the solar cell.

Even in a case where the crystalline wafer of the solar cell is about 150 μm as shown in FIG. 7, the warping can be reduced to 2 mm or less, and yield or productivity in the subsequent module step can be largely improved.

In consequence, it is possible to inhibit the solar cell 1 from being damaged, improve an operation efficiency in the manufacturing steps, and improve a manufacturing yield even when a wiring line member similar to the conventional member is used without using any expensive material such as titanium as the wiring line member 2.

Embodiment 2

It is to be noted that in the above embodiment, it has described a case where the non-linearity of each wiring line member 2 is corrected without applying any load in a drawing direction, but there is a case where the wiring line member 2 cannot be effectively corrected without applying a certain degree of load in the drawing direction depending on specifications (thickness, width, etc.) of the wiring line member.

Figure 4:
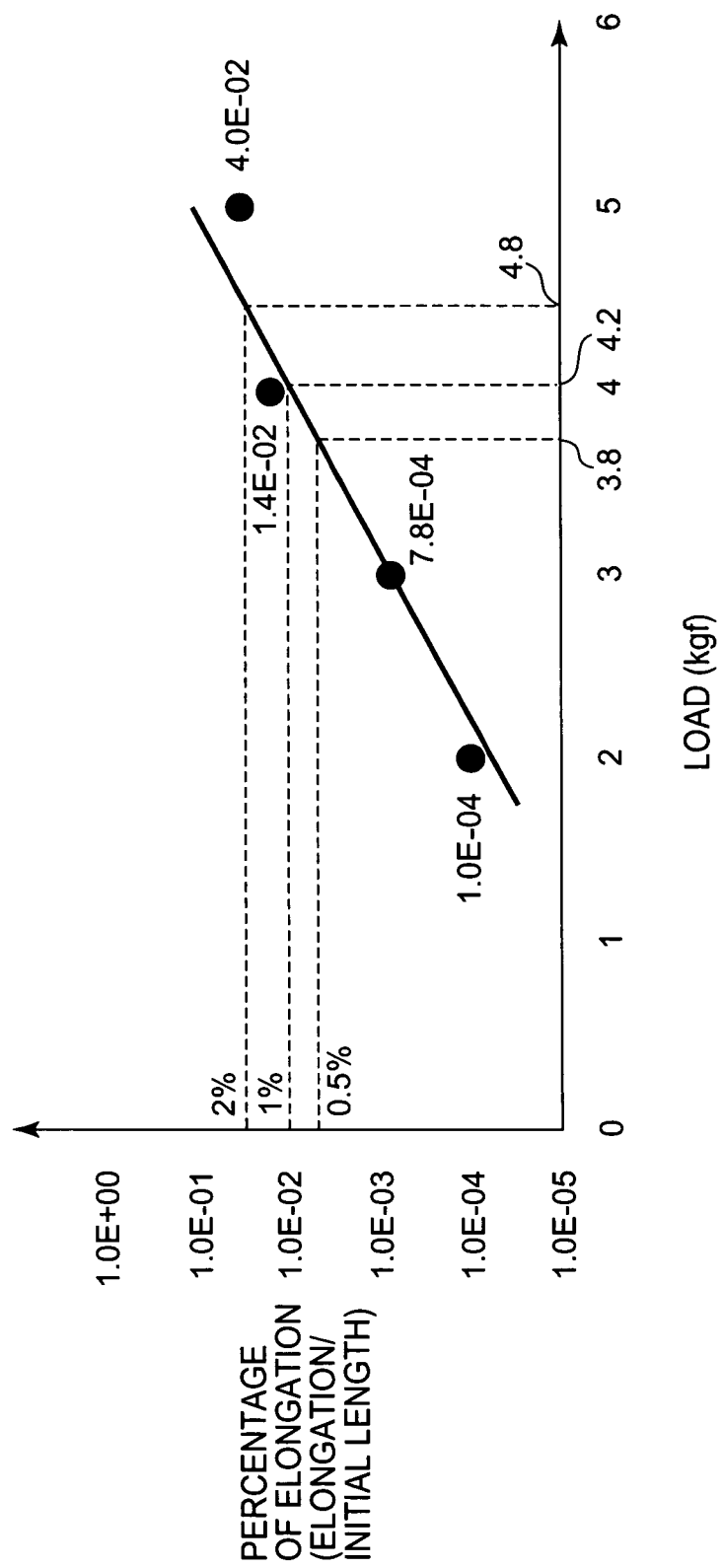
FIG. 4 is a diagram showing a percentage of elongation with respect to a load (tensile load) of a copper foil constituting the wiring line member in a drawing direction.

In such a case, the non-linearity is corrected by applying the load in the drawing direction to the wiring line member 2 before soldering in the same manner as in a conventional example. Even in this case, if the plastic strain of the wiring line member 2 is set to 2% or less, warping can be reduced to 2 mm or less even in a solar cell of a crystalline wafer having a thickness of 200 μm. Furthermore, when the plastic strain of the wiring line member 2 is 1% or less, the warping can be reduced to 2 mm or less even in the solar cell of the crystalline wafer having a thickness of 180 μm or less, for example, 170 μm. In addition, when the plastic strain of the wiring line member 2 is set to 0.5% or less, the warping can be reduced to 2 mm or less even in a solar cell of a crystalline wafer having a thickness of 150 μm or less, for example, 150 μm (FIGS. 4, 7).

Embodiment 3

Figure 3:
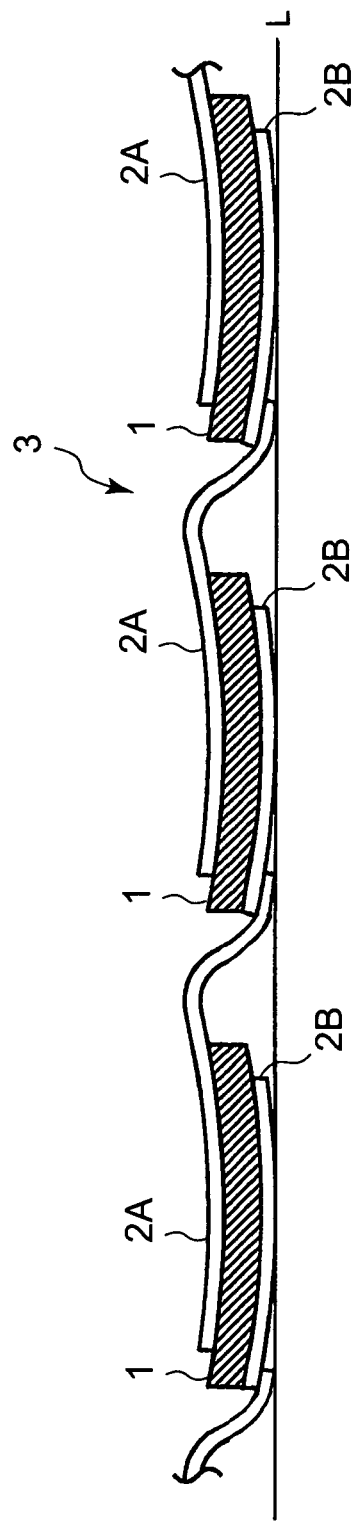
FIG. 3 is a side view of a string of solar cell module of another example to which the present invention is applied (Embodiment 3)

Next, FIG. 3 shows another embodiment of the present invention. In this case, wiring line members 2A for the front surface side of a solar cell 1, and wiring line members 2B for the back surface side are prepared as wiring line members 2. Each of the wiring line members 2A, 2B is constituted of a copper foil (copper: purity 99.9% or more) in the same manner as in the above embodiment, and coated with a solder. Moreover, the wiring line members 2A are soldered to the front surface side of each solar cell 1, and the wiring line members 2B are soldered to the back surface side of each solar cell 1 in the same manner as in the above embodiment.

Here, during the soldering of the respective wiring line members 2A, 2B, the members are exposed to hot air or irradiated with a lamp heater as described above. In a case where a hot plate for keeping warm is disposed under a conveyance belt, the front surface side (top) of the solar cell 1 is directly heated by hot air or the lamp heater from above, but the back surface side (undersurface) of the cell is heated with heat transmitted through the solar cell 1 or the wiring line members 2A. As to a temperature drop speed after the soldering, the temperature rapidly drops on the front surface side, and the speed is retarded on the back surface side. Therefore, contraction on the front surface side of the solar cell 1 itself tends to be larger than that on the back surface side.

Therefore, differently from above method, in a case where the wiring line members 2A, 2B are soldered to the front surface side and the back surface side of the solar cell 1 beforehand to connect the wiring line members 2A to the wiring line members 2B of the adjacent solar cells 1, 1, when a plastic strain of the wiring line member 2B on the back surface side in the drawing direction is set to be larger than that of the wiring line member 2A on the front surface side in the drawing direction, the solar cell 1 can be inhibited from being warped upwards in FIG. 3 by contraction of the wiring line member 2B on the back surface side.

Moreover, conversely, in a case where the solar cell 1 itself warps on a side opposite to FIG. 3, that is, downwards, when the plastic strain of the wiring line member 2A on the front surface side in the drawing direction is set to be larger than that of the wiring line member 2B on the back surface side in the drawing direction, the warpage of the solar cell 1 can be suppressed by the contraction of the wiring line member 2A on the front surface side.

There will be described a method of setting the plastic strain of each wiring line member 2A to be different from that of each wiring line member 2B in the drawing direction. For example, in a case where the plastic strain of the wiring line member 2B in the drawing direction is set to be larger than that of the wiring line member 2A, the method is achieved by using, as the wiring line member 2A, a member corrected into a linear shape in a system in which the member is not corrected by extension as described above, and by using, as the wiring line member 2B, a member corrected into the linear shape by the extension and vice versa. And it is available that the wiring line member 2A and 2B are corrected into a linear shape by differently loading in the drawing direction to set the plastic strain of the wiring line member 2A to be different from that of the wiring line member 2B in the drawing direction.

Figure 5:
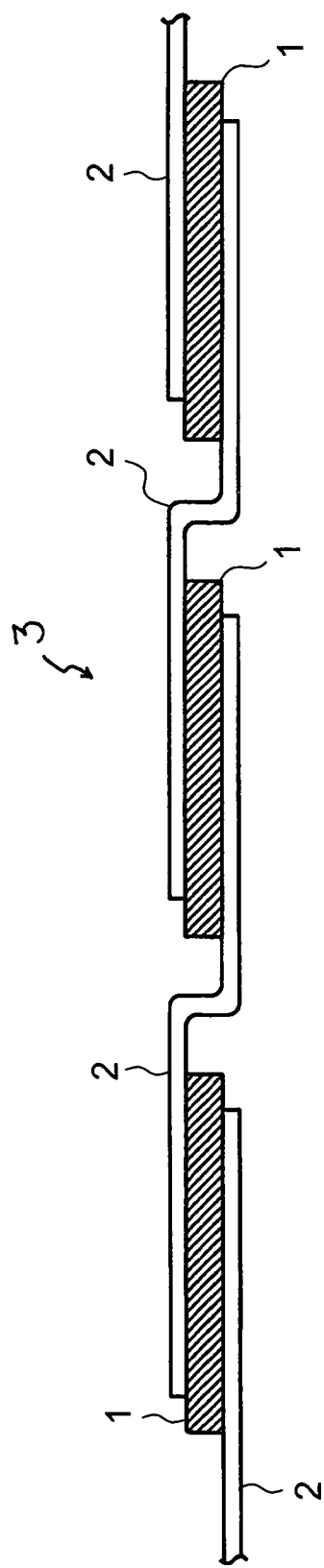
FIG. 5 is a side view of a conventional string using a solar cell having a large thickness.
Figure 6:
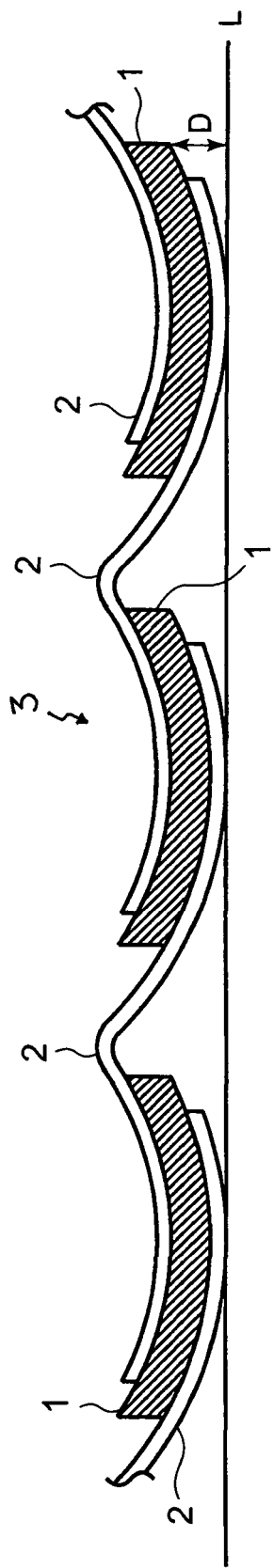
FIG. 6 is a side view of a conventional string using a solar cell having a small thickness.
Figure 8:
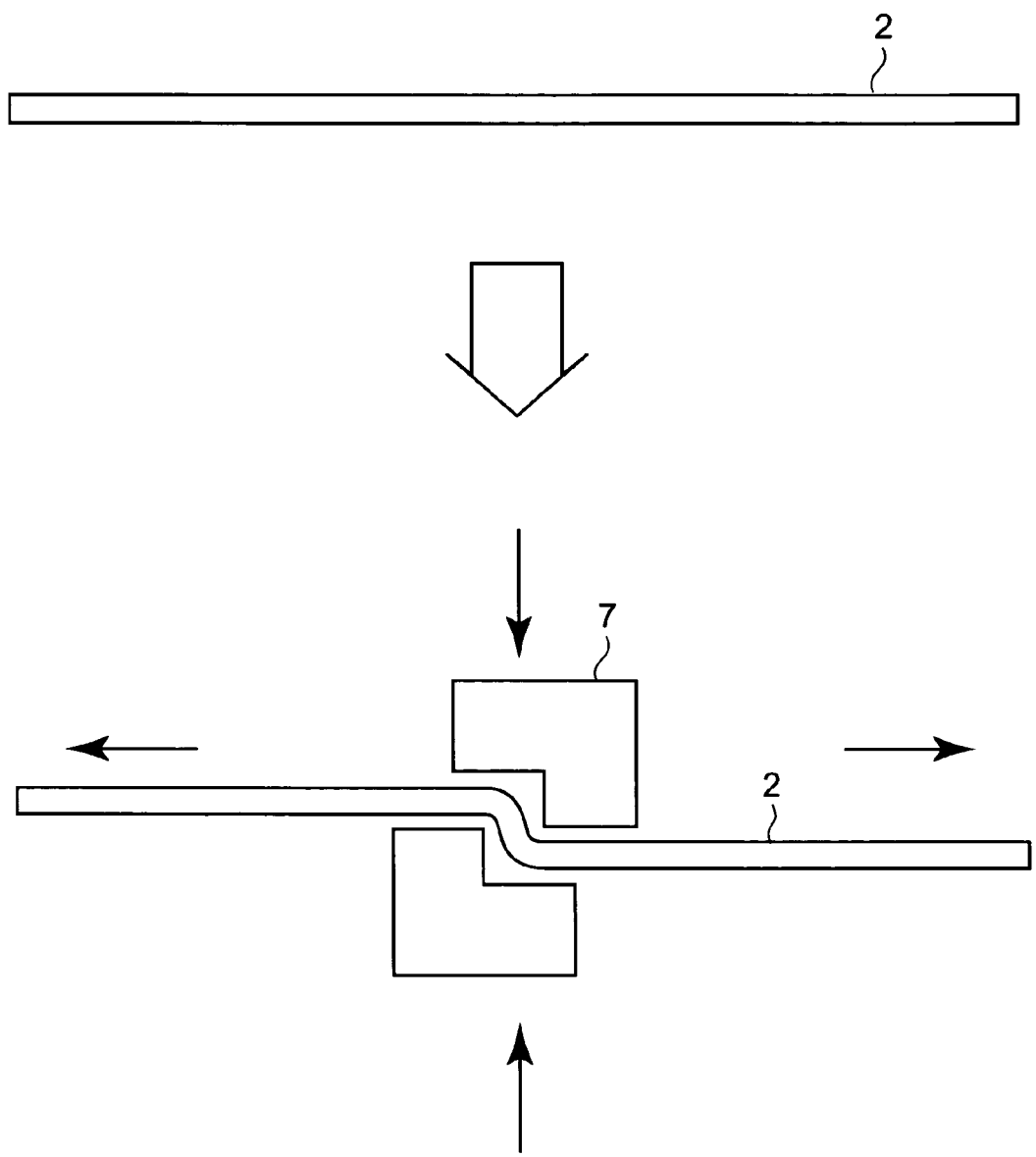
FIG. 8 is an explanatory view showing a method of setting a plastic strain in the drawing direction, which changes on a stepped portion of the wiring line member as a boundary.

In this embodiment, separate members are prepared for the wiring line members 2A and 2B, but the same wiring member may be used. In this case, the plastic strain may be partially changed. In general, the stepped portion shown in FIG. 8 is disposed in substantially the center of the wiring line member 2 between the solar cells 1 as shown in FIG. 5. However, when this step of forming the stepped portion, it is possible to easily change the load before and after the step of forming the stepped portion. That is, the wiring line member 2 is vertically pressed by a jig 7 during the forming of the stepped portion as shown in FIG. 8. Therefore, when another tensile load (load in the drawing direction) is applied to the wiring line member 2 in a horizontal direction, it is possible to realize the wiring line member whose plastic strain differs on the stepped portion as a boundary.

As described above, in the solar cell 1, there is used a material whose plastic strain in the drawing direction of a portion of the wiring line member on the front surface side of the cell differs from that of a portion of the wiring line member on the back surface side of the cell. In this case, there is reduced the drawing-direction plastic strain of the wiring line member disposed on the surface which more largely contracts. In consequence, it is possible to further inhibit the solar cell 1 from being warped. Remarkably effect is obtained in the case that the solar cell is formed into more than 125 mm square or almost square In the present invention, it has been found that the plastic strain of the wiring line member can be changed to thereby inhibit the solar cell from being warped. It is considered that the wiring line member to which a large plastic strain has been imparted has its flexibility impaired, and a force to relax the warping caused by a linear expansion coefficient difference is impaired. When the plastic strain is set to 2% or less as in the present invention, it is possible to prevent or inhibit a disadvantage that the force to relax such warping is impaired.

It is to be noted that it has been described in the embodiments that the wiring line member wound around the bobbin is used, but the present invention is not limited to the embodiments, and the present invention is effective even in a case where the bent wiring line member is corrected into the linear shape, and used. In the embodiments, the wiring line member whose surface is coated with the solder is used, but the present invention is effective even in a case where the solar cell is coated with a paste, and connected to the wiring line member. Furthermore, it has been described in the embodiments that two collector electrodes are disposed on the opposite surfaces of the solar cell, respectively, and a plurality of branched electrodes are extended from the opposite sides of the electrodes, but the present invention is not limited to the embodiments, and a large number of (a plurality of) collector electrodes may be disposed, or plate-like collector electrodes may be disposed especially on the back surface side.

The following invention can be claimed based on present embodiment;

A method of manufacturing a solar cell module, comprising the step of: electrically connecting adjacent solar cells to one another by wiring line members, the method further comprising:

the step of providing the wiring line member which a plastic strain of a base material of it in the drawing direction is 2% or less, and the step of connecting the solar cells to one another by the wiring line member.

The solder connection is desirable.

What is claimed is:
1. A solar cell module comprising
a plurality of solar cells and wiring line members electrically connecting adjacent ones of the solar cells to one another, wherein a base material of the wiring line members has a plastic strain of 2% or less in a longitudinal drawing direction;

wherein at least one of the wiring line members comprises a portion on a front surface side of a first solar cell and another portion on a back surface side of an adjacent second solar cell;

wherein the plastic strain of the wiring line member before being connected to the solar cells is set to be between 0.03% and 2% in the longitudinal drawing direction, as measured by elongation/initial length; and wherein the base material of the wiring line member consists of copper.

2. The solar cell module according to claim 1, wherein the solar cell comprises a crystalline wafer having a thickness of 200 microns or less, wherein warping of the crystalline wafer is reduced.

3. The solar cell module according to claim 1, wherein the plastic strain in the drawing direction of the base material of the portion of the wiring line member on a front surface side of the solar cell differs from that of the other portion of the wiring line member on a back surface side of the solar cell.

4. A method of manufacturing a solar cell module, comprising:

electrically connecting adjacent solar cells to one another by wiring line members, wherein a base material of the wiring line member consists of copper;

correcting linearity of each wiring line member prior to the step of connecting the wiring line members to the solar cells, the correcting step further comprising pulling the wiring line member in a drawing direction, thereby creating a plastic strain of a base material of the wiring line member in the drawing direction, the plastic strain before being connected to the solar cell being between 0.03% and 2%, as measured by elongation/initial length.

5. The method of manufacturing the solar cell module according to claim 4, wherein the correcting step comprises the steps of:

disposing a portion of the wiring line member disposed between the solar cells on a stepped portion; and separately pulling the wiring line member in the drawing direction so that the plastic strain of the base material in the drawing direction changes across the stepped portion acting as a boundary.

6. The solar cell module according to claim 1, wherein the copper is 99% pure.

7. The solar cell module according to claim 6, wherein the copper is 99.9% pure.

8. The method according to claim 4, wherein the copper is 99% pure.

9. The method according to claim 8, wherein the copper is 99.9% pure.

10. The solar cell module according to claim 1, wherein the wiring line members have a width of, approximately 2 mm and a thickness of approximately 0.15 mm, and the solar cells are approximately 125 mm square.

11. The solar cell module according to claim 10, wherein the solar cell has a thickness of 0.15 mm to 2 mm and the plastic strain is 0.5% or less.

12. The solar cell module according to claim 10, wherein the solar cell has a thickness of 0.2 mm and the plastic strain is 2% or less.

13. The solar cell module according to claim 12, wherein the solar cell has a thickness of 0.2 mm and the plastic strain is 0.4% or less.

14. The solar cell module according to claim 10, wherein the solar cell has a thickness of 0.17 mm and the plastic strain is 0.2% or less.

15. The solar cell module according to claim 10, wherein the solar cell has a thickness of 0.15 mm and the plastic strain is 0.1% or less.

16. A solar cell module comprising a plurality of solar cells and wiring line members electrically connecting adjacent ones of the solar cells to one another, wherein a base material of the wiring line member has a plastic strain of 2% or less in a longitudinal drawing direction;

wherein the base material of the wiring line member consists of copper; and wherein the plastic strain in the drawing direction of the base material of a portion of the wiring line member on a front surface side of the solar cell differs from that of a portion of the wiring line member on a back surface side of the solar cell.

17. The solar cell module according to claim 16, wherein the solar cell comprises a crystalline wafer having a thickness of 200 microns or less, wherein warping of the crystalline wafer is reduced.

* * * * *